United States Patent
Huang

(10) Patent No.: US 8,055,229 B2
(45) Date of Patent: Nov. 8, 2011

(54) LOW NOISE, HIGHLY LINEAR AMPLIFYING STAGE AND SIGNAL RECEIVER USING THE SAME

(75) Inventor: Yi-Ti Huang, Zhubei (TW)

(73) Assignee: Maxrise Inc., Hsin-Chu (TW)

( * ) Notice: Subject to any disclaimer, the term of this patent is extended or adjusted under 35 U.S.C. 154(b) by 665 days.

(21) Appl. No.: 12/219,413

(22) Filed: Jul. 22, 2008

(65) Prior Publication Data
US 2010/0022211 A1 Jan. 28, 2010

(51) Int. Cl.
*H04B 1/06* (2006.01)
(52) U.S. Cl. .............. 455/232.1; 455/234.2; 455/245.2; 455/246.1; 455/247.1; 455/250.1; 455/133; 455/138; 330/254; 330/278
(58) Field of Classification Search .... 455/232.1–253.2, 455/127.2, 3.02, 136, 133, 138; 375/345, 375/297; 330/254, 278; 324/200, 654
See application file for complete search history.

(56) References Cited

U.S. PATENT DOCUMENTS

| | | | |
|---|---|---|---|
| 4,598,252 A * | 7/1986 | Andricos | 330/51 |
| 5,001,486 A * | 3/1991 | Bachtiger | 342/42 |
| 6,911,829 B2 * | 6/2005 | Hilliard et al. | 324/654 |
| 7,039,376 B2 | 5/2006 | Isoda | |
| 7,242,871 B2 * | 7/2007 | Huang et al. | 398/210 |
| 7,486,135 B2 * | 2/2009 | Mu | 330/51 |
| 2003/0038624 A1 * | 2/2003 | Hilliard et al. | 324/200 |
| 2007/0126508 A1 | 6/2007 | Montemayor et al. | |
| 2007/0275686 A1 | 11/2007 | Stevenson et al. | |
| 2008/0207154 A1 * | 8/2008 | Gohn et al. | 455/296 |

* cited by examiner

*Primary Examiner* — Junpeng Chen
(74) *Attorney, Agent, or Firm* — Bacon & Thomas, PLLC

(57) ABSTRACT

The invention provides a signal amplifying stage, used in a signal receiver. The signal amplifying stage has: a fixed-gain low noise amplifier (LNA), amplifying an input signal; a variable-gain LNA (VG-LNA) array, amplifying the input signal, including a plurality of parallel VG-LNAs, the VG-LNA array being parallel with the fixed-gain LNA; a variable-gain amplifier (VGA), being in series with the fixed-gain LNA and the VG-LNA array, for amplifying output signals from the fixed-gain LNA and the VG-LNA array to generate an output signal; an attenuator, being in parallel with a combination of the fixed-gain LNA, the VG-LNA array and the VGA, for attenuating the input signal to generate the output signal; and a control loop, coupled to the VGA and the attenuator, for detecting power levels of the output signal to enable and control the fixed-gain LNA, the VG-LNA array, the VGA and the attenuator.

15 Claims, 7 Drawing Sheets

LOW NOISE, HIGHLY LINEAR AMPLIFYING STAGE AND SIGNAL RECEIVER USING THE SAME

BACKGROUND OF THE INVENTION

1. Field of the Invention

The present invention generally relates to a low noise, highly linear amplifying stage and a signal receiver using the same, which have wide dynamic range and good noise performance by combining active amplifiers and passive attenuators.

2. Description of Related Art

In telecommunication systems, RF (radio frequency) signals or input signals can be distributed to destination devices over a wide area using, for example wireless communication links or wireline communication links. Signal receivers may select between wireless signals received or wireline signals received. In general, wireless signals received are much weaker than wireline signals received. The received signals strength at the receivers may vary over a wide range due to the different characteristics of the wireless links and the wireline links.

TV tuners, which is a kind of signal receivers, need to provide both low noise and highly linear (i.e. wide dynamic range) variable gain. FIGS. 1~3 show several related arts in signal receivers.

FIG. 1 shows a prior art Radio Frequency (RF) tuner with Automatic Gain Control (AGC) used in conventional signal receivers. System 199 is a Radio Frequency (RF) tuner with Automatic Gain Control (AGC). The system 199 includes: a front-end attenuator 100 that receives an RF input signal, a low-noise amplifier (LNA) 110, a filter 120, a mixer 130, a filter 140, a mixer 150, a digital attenuator 155, and broadband power detectors 160, 170, 180. Power detector 160 is placed after LNA 110, power detector 170 is placed after filter 120, and power detector 180 is placed after mixer 150 and filter 140. Each of power detectors 160, 170, 180 measures the total power in the signal at each respective placement point.

System 199 also includes control block 190 which receives measured power levels from detectors 160, 170, 180 and controls the attenuation by adjusting digital attenuators 100 and/or 150.

However, in FIG. 1, Applicant perceives that the front-end attenuator 100 preceding the LNA 110 constrains the noise figure of the system 199 to be large. That is, Applicant perceives that the noise performance of the system 199 in FIG. 1 is not good enough.

FIG. 2 is a simplified functional block diagram of a prior variable gain amplifier 240. The variable gain amplifier 240 includes a passive attenuator 242 in series with a variable gain stage 244. The amplifier 240 further includes a gain control circuit 246, which controls the attenuation provided by the attenuator 242 and the variable gain provided by the variable gain stage 244, based on feedback signals from other circuits in the signal receiver applying the amplifier 240.

Similarly, Applicant perceives that the passive attenuator 242 preceding the variable gain stage 244 also constrains the noise figure of the variable gain amplifier 240 to be larger than 3 dB. That is, Applicant perceives that the noise performance of the variable gain amplifier 240 in FIG. 2 is not good enough.

FIG. 3 shows another prior AGC amplifier circuit. In FIG. 3, reference numeral 310 represents a signal input terminal, reference numeral 320 represents a fixed-gain amplifier of which the gain does not depend on an AGC voltage, reference numeral 330 represents a variable-gain amplifier (VGA), reference numeral 340 represents a signal output terminal, reference numeral 350 represents an AGC voltage input terminal, reference numeral 360 represents a differential amplifier for level conversion, and reference numeral 370 represents a reference voltage generator circuit. Here, the reference voltage generator circuit 370 supplies a stable reference voltage Vref to the differential amplifier 360. The signal fed in via the terminal 310 is fed to the fixed-gain amplifier 320 and to the variable-gain amplifier 330. The differential amplifier 360 generates AGC voltages Vagc2' and Vagc2 which vary according to the AGC voltage Vagc.

Applicant perceives that the AGC amplifier circuit in FIG. 3 has limited gain control range because it applies only one VGA. Further, during normal operation, either the active fixed-gain LNA 320 or the active VGA 330 will be active, so Applicant perceives that the linearity performance is also limited.

Therefore, how to solve the above problems is important in RF signal receivers. However, it is difficult to design a very linear amplifying stage capable of amplifying large input signals in a linear fashion which simultaneously possesses continuous or discrete gain control. A further complication is the desire to implement a relatively large dynamic range over which gain control operates. Further, it also needs a RF signal receiver which provides low noise figure, continuous or discrete gain control and wide dynamic range.

SUMMARY OF THE INVENTION

The present invention is directed to a RF signal amplifying stage for amplifying RF signals with highly linear, continuous or discrete gain control and good noise performance by combining active fixed-gain LNA, active VG-LNA array and passive attenuator.

The present invention is directed to a signal receiver for amplifying signals with highly linear, continuous or discrete gain control and good noise performance by combining active fixed-gain LNA, active VG-LNA array and passive attenuator in a front-end amplifying stage.

One embodiment of the present invention provides a signal amplifying stage, used in a signal receiver. The signal amplifying stage includes: a fixed-gain low noise amplifier (LNA), receiving and amplifying an input signal; a variable-gain LNA (VG-LNA) array, receiving and amplifying the input signal, including a plurality of parallel VG-LNAs, the VG-LNA array being parallel with the fixed-gain LNA; a variable-gain amplifier (VGA), being in series with the fixed-gain LNA and the VG-LNA array, for receiving and amplifying output signals from the fixed-gain LNA and the VG-LNA array to generate an output signal; an attenuator, being in parallel with a combination of the fixed-gain LNA, the VG-LNA array and the VGA, for receiving and attenuating the input signal to generate the output signal; and a control loop, coupled to the VGA and the attenuator, for detecting power levels of the output signal to enable and control the fixed-gain LNA, the VG-LNA array, the VGA and the attenuator.

Another embodiment of the invention provides a signal receiver, including: a signal amplifying stage, for receiving and amplifying an input signal to generate a first output signal, the signal amplifying stage amplifying the input signal in a fixed gain, in gain values or in attenuation, the variable gains and the attenuation steps being controlled by a close loop control in accordance with power levels of the first output signal; a mixer stage, coupled to the signal amplifying stage, for mixing the first output signal with a reference clock signal to generate second output signals; and an output section, for receiving, filtering, amplifying and cancelling offset of the second output signals from the mixer stage to generate a third output signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
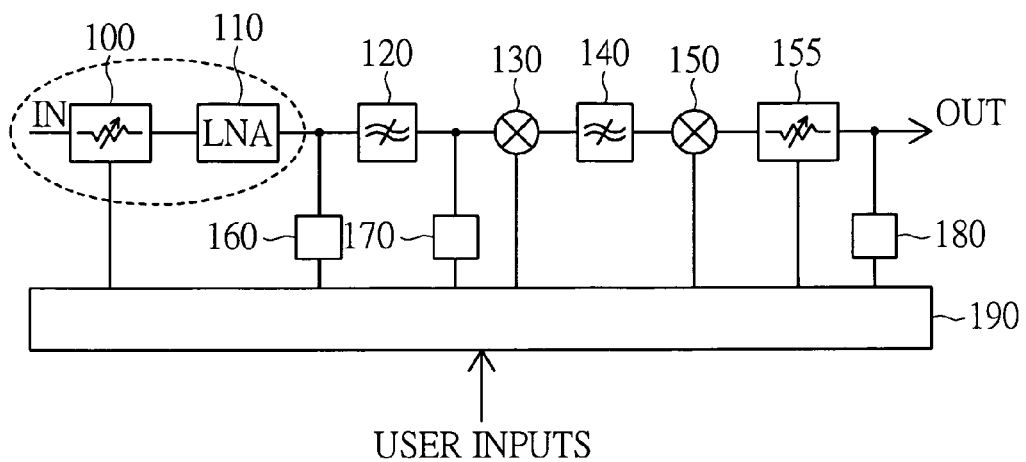
FIG. 1 shows a prior art Radio Frequency (RF) tuner with Automatic Gain Control (AGC).
Figure 2:
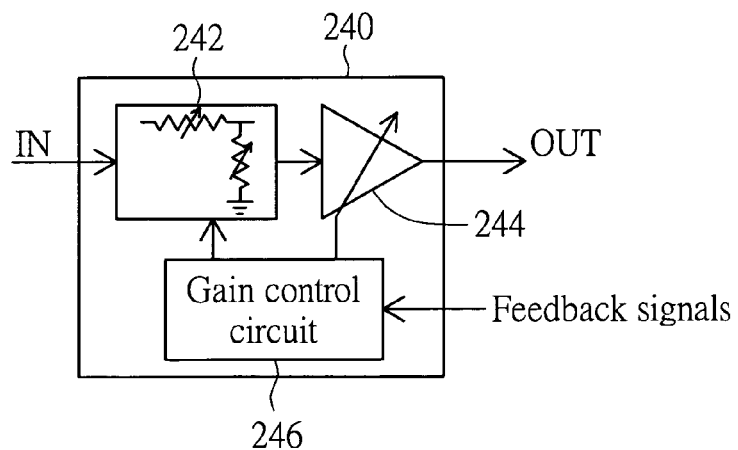
FIG. 2 is a simplified functional block diagram of a prior variable gain amplifier 240.
Figure 3:
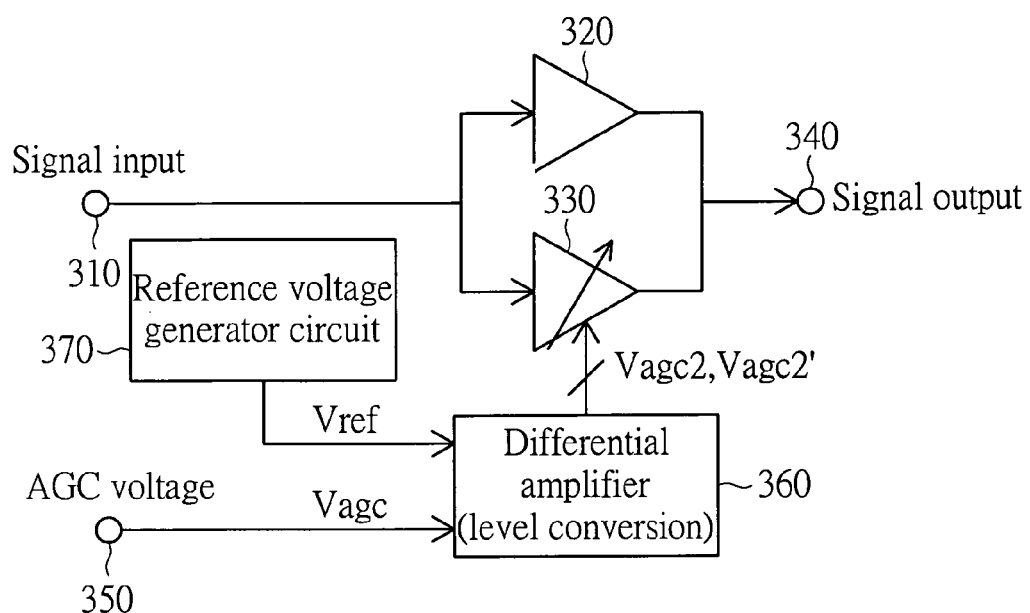
FIG. 3 shows another prior AGC amplifier circuit.

Reference will now be made in detail to the present preferred embodiments of the invention, examples of which are illustrated in the accompanying drawings. Wherever possible, the same reference numbers are used in the drawings and the description to refer to the same or like parts.

An embodiment of the invention provides a receiver implementing a wide dynamic range, continuous or discrete gain control and low noise figure. The disclosed receiver is for example, configured to operate as a television receiver in a system. The system, applying the disclosed receiver, can be a television, television receiver, set top box, or television tuner integrated within a video recorder or some other television receiver. In other embodiments, the system can be a radio receiver, wireless transceiver, telephone receiver, cellular telephone, cordless telephone, or some other communication device.

The signal receiver disclosed in the embodiment of the invention can be coupled to one or more signal sources, including wireless signals received via an antenna, and wired signals received via cables coupled to a cable television system. The receiver is not limited to coupling only one type of signal. For example, the receiver can be coupled to a television signal source, for example, via the antenna and can be simultaneously coupled to a radio source, for example, via the cable.

The receiver can receive signals that vary across a wireless signal dynamic range when the receiver couples the signal from the antenna. Similarly, the receiver can receive signals that vary across a cable system dynamic range when the receiver couples the signals from the wired source via the cable. Typically, the wireless signals have larger dynamic range than the cable system signals. Additionally, the wireless signal may span a range of power levels that is lower than the low power within the cable system signals. However, the receiver is configured to process either the wireless or wired signal, and thus needs to have the ability to operate over both the wireless dynamic range and the cable dynamic range.

In the embodiment of the invention, a highly linear (wide dynamic range), variable gain and low noise amplifying stage and a signal receiver applying the same are disclosed. In the amplifying stage, multiple signal paths in parallel deal with weak and strong received signal strength respectively, and are controlled in close loop based on feedback signals indicating signal power levels. Therefore, the amplifying stage can achieve very large gain control range for wide dynamic range operation.

Figure 4:
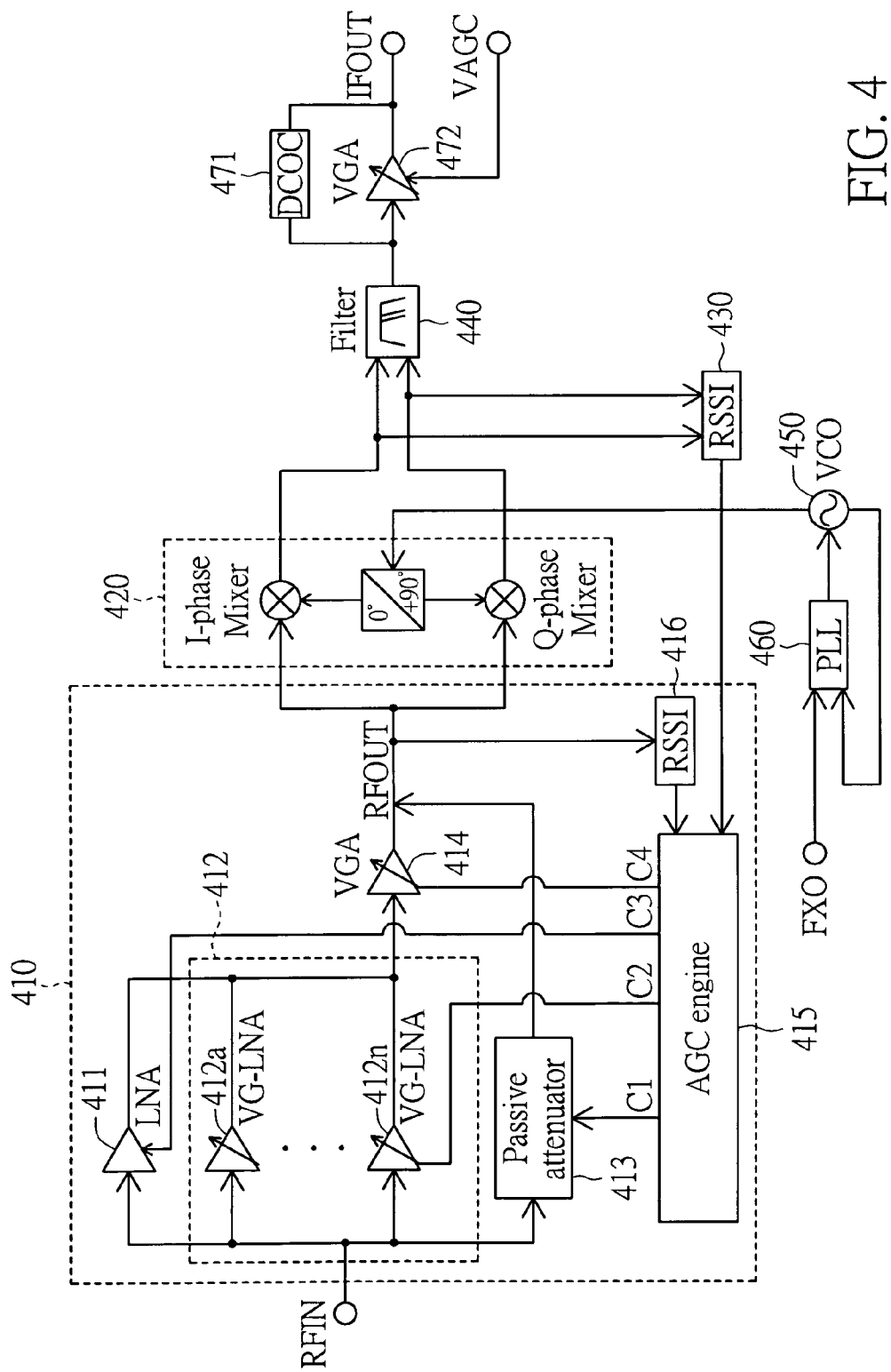
FIG. 4 shows a function block diagram of a signal receiver according to an embodiment of the invention.

FIG. 4 shows a function block diagram of a signal receiver according to one embodiment of the invention. The receiver 400 may include one or more variable gain amplifying stage and an automatic gain control loop in order to compensate for at least a portion of the variations in the received signal strength. Continuous or discrete gain control is also achieved by the receiver 400 because it allows for closed-loop control to maintain constant signal amplitude at an output of the receiver 400. One or more continuously-variable gain elements can be distributed throughout the receiver's signal path.

RF input signal RFIN coupled to the receiver 400 may be for example, analog television signals formatted according to an analog television standard, such as NTSC, PAL, SECAM, or some other analog television standard. The RF input signal RFIN can also be digital television signals, such as digital DVB-T television signals.

As shown in FIG. 4, the signal receiver 400 includes a highly linear (wide dynamic range), variable gain and low noise amplifying stage 410, a mixer stage 420, a power detector 430, a filter 440, a VCO (Voltage controlled oscillator) 450, a PLL (Phase Locked Loop) 460, a DCOC (DC-offset cancellation) circuit 471 and a VGA (variable gain amplifier) 472.

The amplifying stage 410 includes a fixed-gain LNA (Low Noise Amplifier) 411, a VG-LNA (Variable Gain Low Noise Amplifier) array 412, a passive attenuator 413, a VGA (Variable Gain Amplifier) 414, an AGC engine 415 and a power detector 416. The VG-LNA array 412 includes a plurality of parallel VG-LNAs 412a~412n. The amplifying stage 410 amplifies an RF input signal RFIN in highly linear (wide dynamic range), variable gain and low noise to generate an RF output signal RFOUT.

The highly linear, wide dynamic range variable gain amplifying stage 410 is useful where signals with very large dynamic ranges exist and where linear gain control is desired. It is particularly useful where it is desired to implement linear gain control on an integrated circuit. One example is in communication receivers such as a television tuner, which may receive weak signals from an antenna or strong signals from a cable distribution network.

The wide dynamic range variable gain amplifying stage 410 may be a single-ended circuits or differential circuits. For example, the control lines from the AGC engine 415 to the LNA 411, the VG-LNA array 412 and the passive attenuator 413 may be configured as differential signals.

The LNA 411 is in parallel with the VG-LNAs 412a~412n of the VG-LNA array 412. The LNA 411 is serially connected with the VGA 414. The LNA 411 receives the RF input signal RFIN and accordingly amplifies it. An output signal from the LNA 411 is further amplified and processed by the VGA 414. In other words, if the LNA 411 and the VGA 414 are both enabled by the AGC engine 415, the RF input signal RFIN is amplified by both the LNA 411 and the VGA 414 to generate the RF output signal RFOUT.

Similarly, the VG-LNAs 412a~412n of the VG-LNA array 412 are serially connected with the VGA 414. During normal operation of the signal receiver 400, at any moment, one of the VG-LNAs 412a~412n of the VG-LNA array 412 is enabled to receive the RF input signal RFIN and accordingly amplify it. Output signals from the VG-LNAs 412a~412n of the VG-LNA array 412 is further amplified/processed by the VGA 414. In other words, if the VGA 414 and one of the VG-LNAs 412a~412n are both enabled by the AGC engine 415, the RF input signal RFIN is amplified by both the VGA 414 and the enabled one of the VG-LNAs 412a~412n to generate the RF output signal RFOUT. Further, each of the VG-LNA 412a~412n in the VG-LNA array 412 can have small gain range for better noise figure performance and bandwidth extension. Still further, in the current deep sub-micro technology, the silicon area of the VG-LNA array 412 is not significant.

The passive attenuator 413 is parallel with the combination of the LNA 411, the VG-LNA array 412 and the VGA 414. The passive attenuator 413 receives the RF input signal RFIN and accordingly amplifies it to generate the RF output signal RFOUT. In other words, if the passive attenuator 413 is enabled by the AGC engine 415, the RF input signal RFIN is attenuated and processed by the passive attenuator 413 into the RF output signal RFOUT.

The passive attenuator 413 is configured to provide one of discrete attenuation values. For example, the passive attenuator 413 is configured to provide a plurality of attenuation values, where each attenuation value differs from the nearest attenuation value by approximately a fixed value. The passive attenuator 413 allows for a very linear gain control to improve linearity and signal-handling capabilities, while preserving continuous or discrete gain control.

The passive attenuator 413 is configured to provide discrete attenuation values, each of which can be selected by the AGC engine 415. The passive attenuator 413 is configured to provide a range of attenuation values that, when combined with the gain range of the LNA 411 and the VG-LNA array 412, spans the desired total dynamic range.

Further, the passive attenuator 413 is configured as a step attenuator with fixed step size. The gain steps are typically implemented as log-linear steps of equal size, although such an attenuator step configuration is not a limitation. The attenuator step size can be, for example, 2 dB, 3 dB, 5 dB, 7 dB, 10 dB, or some other attenuator step size.

In the embodiment, the attenuator 413 is configured as a passive attenuator. The attenuator 413 is typically implemented using passive components, because the passive implementation can be extremely linear over a large power dynamic range as well as consistent over a large frequency range. However, when implemented in an integrated circuit, the attenuator 413 can be implemented using passive devices, active devices, or a combination of passive and active devices. For example, resistors may be implemented as one or more resistors, diodes, or other passive devices. Additionally, one or more of the elements in the attenuator can include one or more active devices, including FETs, transconductance devices, transistors, and the like or some other variable impedance active devices. Some elements in the attenuator can include a combination of passive and active devices.

The attenuator 413 can be capable of continuous or discrete gain control, but may be limited to discrete steps by operation of the AGC engine 415. In an alternative embodiment, the attenuator 413 can be a combination of a plurality of fixed attenuators in parallel, with a multiplexer selecting which of the fixed attenuators to couple to the signal path. In yet another embodiment, the attenuator 413 can be a series connection of a plurality of fixed attenuators, where each of the fixed attenuators can be selectively bypassed.

A Gain Control Module, here shown as the AGC engine 415, controls the attenuation provided by the attenuator 413 and the variable gain provided by the VG-LNA array 412 and the VGA 414 to linearize the gain over the entire dynamic range. The AGC engine 415 outputs control signals C1~C4 to vary the gain of the wide dynamic range variable gain amplifying stage 410 in an Automatic Gain Control loop, based on feedback signals from the power detector 416 and/or from the power detector 430. The control signals C1~C4 can be digital control signals or analog control voltages.

The AGC engine 415 can store control values corresponding to each of the discrete attenuation values provided by the attenuator 413 and the gain values provided by the VG-LNA array 412 and the VGA 414. The AGC engine 415 can store control values in a look-up table in a memory, or the values can be determined by calibrating the attenuator 413 and storing the calibrated control values corresponding to the desired attenuation values.

The LNA 411, the VG-LNA array 412, the attenuator 413 and the VGA 414 are controlled and enabled by the control signals C1~C4 respectively. When the LNA 411 is enabled, the VGA 414 is also enabled; and similarly, when one of the VG-LNA 412a~414n is enabled, the VGA 414 is also enabled. However, when the attenuator 413 is enabled, neither the LNA 411 nor the VG-LNA array 412 is enabled.

Under control of the AGC engine 415, the composite wide dynamic range variable gain amplifying stage 410 can provide a substantially linear gain control response over a dynamic range.

The AGC engine 415 can store discrete attenuation values and gain control ranges.

The power detector 416 detects the power levels of the RF output signal RFOUT and feeds the detection result to the AGC engine 415, so that the AGC engine 415 can output proper control signals C1~C4. The power detector 416 is for example but not limited to an RSSI (Receiving Signal Strength Indicator) which is used to detect power levels.

The mixer stage 420 includes a mixer 421, a 90° phase shifter 422 and a mixer 423. The mixers 421 and 423 may have the same circuit configuration, and receive signals output from the 90° phase shifter 422. The 90° phase shifter 422 generates at least two output signals having a phase difference of 90° from each other. For example, one output signal can be the output signal from the VCO 450 and another output signal can have a phase difference of 90° from the former one. The mixer 421 may be an I-phase (In-phase) mixer while the mixer 423 may be a Q-phase (Quadrant-phase) mixer.

The mixers 421 and 423 mix the RF output signal RFOUT from the amplifying stage 410 and the output signals from the 90° phase shifter 422 for resulting frequency conversion and yielding a baseband signal. For high frequency accuracy, the VCO 450 and the PLL 460 generate a high accuracy clock signal in accordance with a received reference clock signal FXO. The clock signal FXO is a crystal oscillator frequency signal.

The power detector 430 detects power levels of output signals from the mixers 421 and 423. The detection result of the power detector 430 is further fed back to the AGC engine 415 of the amplifying stage 410, for automatic close-loop control.

The filter 440 can perform image rejection and channel selection on the output signals from the mixers 421 and 423. The filter 440 serves to eliminate unnecessary frequency components, such as the signals of the adjacent channels other than the desired signal to be received, and have no gain.

The DCOC circuit 471 is for cancelling DC-offset in the filtered signals from the filter 440 and in output signals from the VGA 472. The DCOC circuit 471 is in parallel connection with the VGA 472. The VGA 472 further amplifies the filtered signals from the filter 440. The VGA 472 is controlled by the analog AGC control voltage VAGC. That is, the gain of the VGA 472 is varied in response to the analog AGC control voltage VAGC. To maximize reception performance, the VGA 472 is controlled as to keep its output level constant by the AGC voltage VAGC.

Figure 5A:
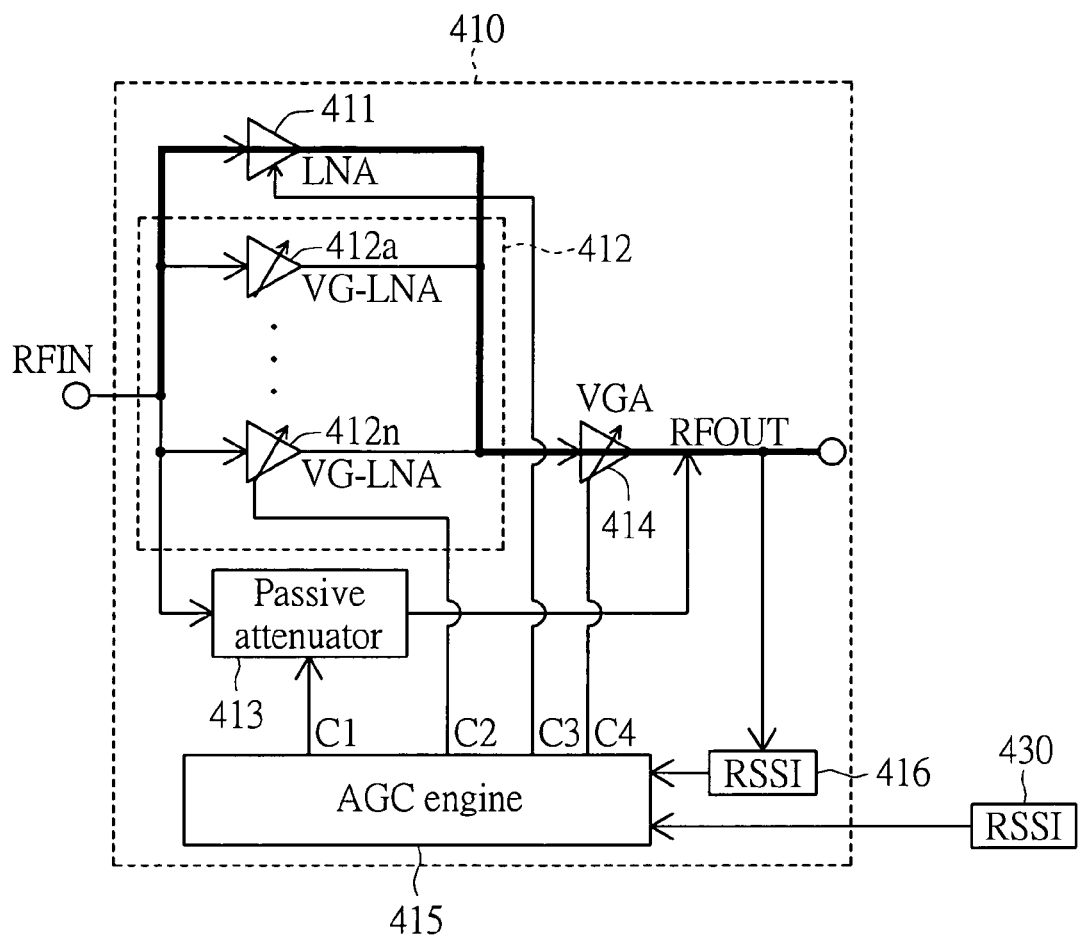
FIGS. 5A~5C show detailed operations of the amplifying stage 410 according to the embodiment of the invention.
Figure 5B:
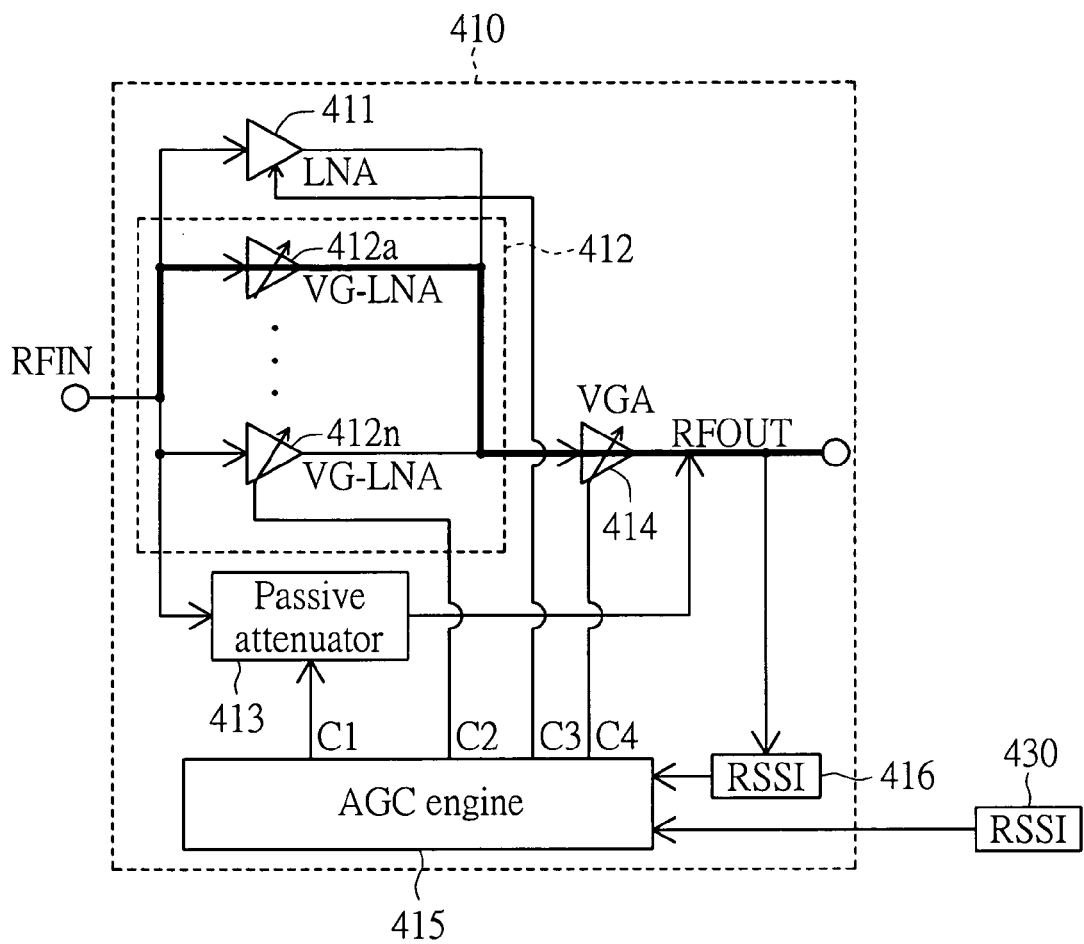
Figure 5C:
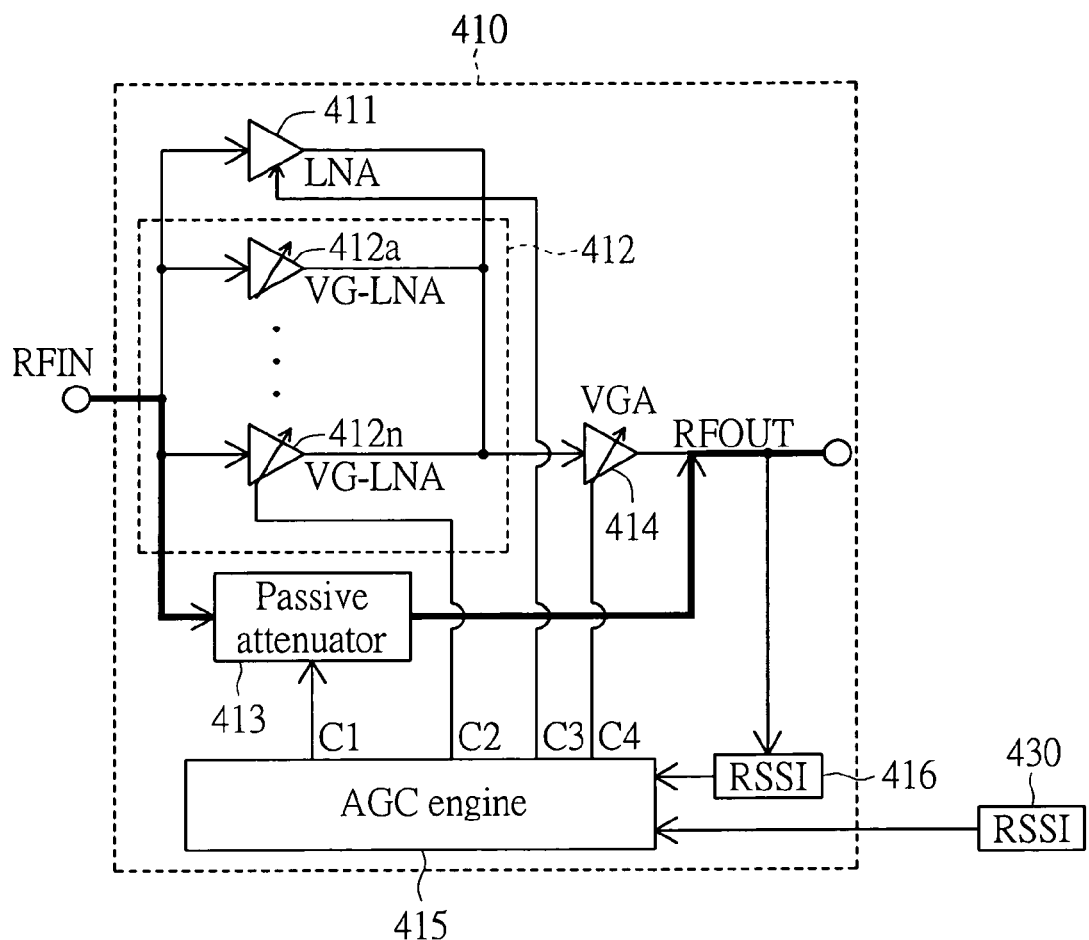

FIGS. 5A~5C show detailed operations of the amplifying stage 410 according to the embodiment of the invention. In FIGS. 5A~5C, the signal paths marked by bold lines refer to the signal paths enabled under control of the AGC engine 415.

As shown in FIG. 5A, when the RF input signal RFIN has small power levels, the fixed-gain LNA 411 and the VGA 414 are both enabled to amplify the small RF input signal RFIN, so that excellent noise figure performance is achieved.

As shown in FIG. 5B, when the RF input signal RFIN has intermediate power levels, the VGA 414 and one among the VG-LNA 412a~412n in the VG-LNA array 412 are both enabled to amplify the RF input signal RFIN, for maintaining good noise figure and still considerable signal amplification needed for signal reception.

As shown in FIG. 5C, when the RF input signal RFIN has high power levels, the attenuator 413 is enabled to attenuate the RF input signal RFIN, for highly linear performance.

Figure 6:
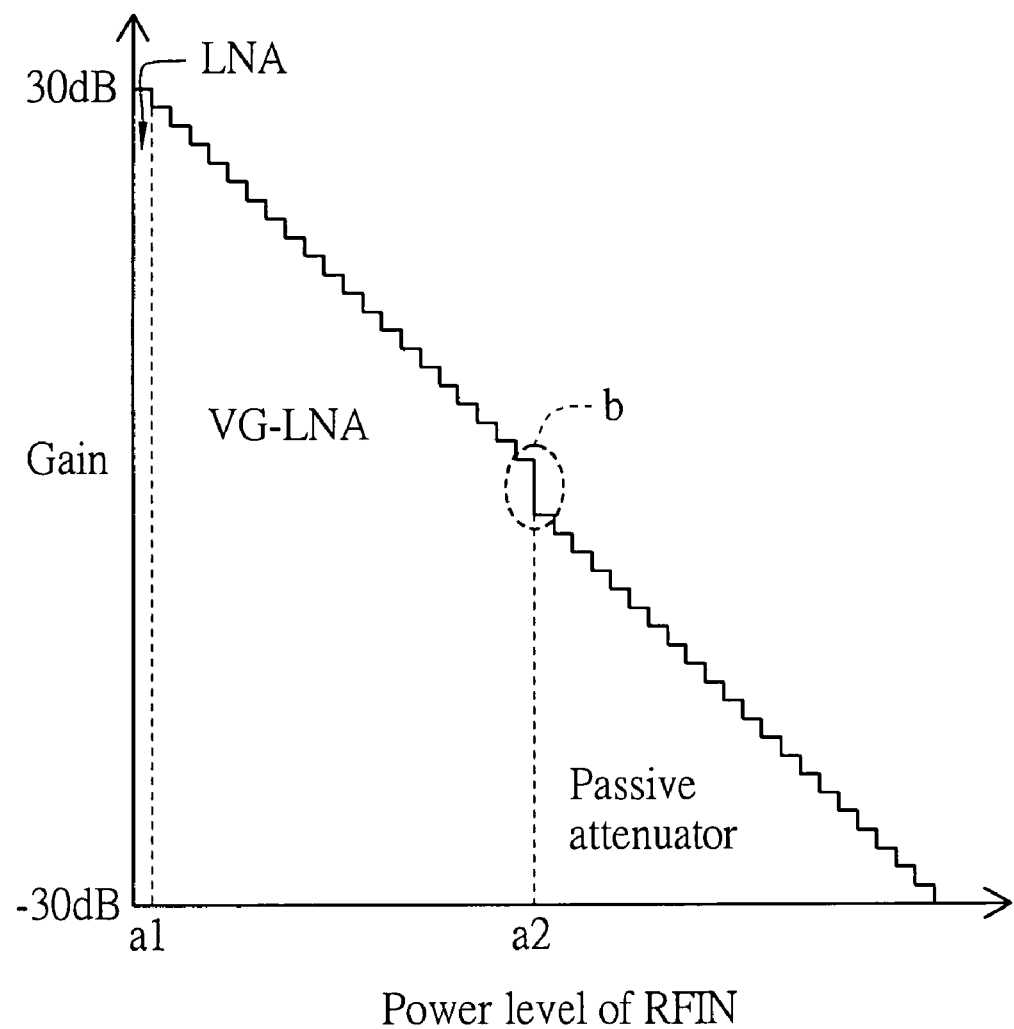
FIG. 6 shows a gain control characteristic of the amplifying stage 410 according to the embodiment of the invention.

FIG. 6 shows a gain control characteristic of the amplifying stage 410 according to the embodiment of the invention. As shown in FIG. 6, when the power of the RF input signal RFIN is very small, i.e. smaller than a value a1, the LNA 411 is enabled for amplifying the small RF input signal RFIN. The LNA 411 has large gain for amplifying.

When power of the RF input signal RFIN is intermediate, i.e. larger than the value a1 but smaller than another value a2, one among the VG-LNA 412a~412n of the VG-LNA array 412 is enabled for amplifying the RF input signal RFIN. In the embodiment of the invention, each of the VG-LNA 412a~412n of the VG-LNA array 412 can have several gain steps. For example, assume that the VG-LNA array 412 achieves 30 gain steps and there are 10 VG-LNAs in the VG-LNA array 412. In one example, each of the 10 VG-LNAs in the VG-LNA array 412 can have 3 gain steps. In other example, the 10 VG-LNAs in the VG-LNA array 412 can have different gain steps. In general, more gain steps achieved by the VG-LNA array 412, more smoothly continuous or discrete gain control performed by the amplifying stage 410; and vice versa.

When power of the RF input signal RFIN is high, i.e. higher than the value a2, then the passive attenuator 413 is enabled for attenuating the RF input signal RFIN.

Further, for guaranteeing monotonic during switch between the passive attenuator 413 and the lowest-gain VG-LNA of the VG-LNA array 412, a large gain step is applied, as shown the reference symbol "b" in FIG. 6.

In summary, the amplifying stage and the signal receiver using the same, according to the embodiment of the invention have at least following advantages:
1. Low noise figure can be achieved by application of the fixed-gain LNA and the VG-LNA array.
2. Continuous or discrete gain control and enough noise performance can be performed by the VG-LNA array and the VGA following the fixed-gain LNA and the VG-LNA array.
3. Highly linear and wide dynamic range can be made by the attenuator alone.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal amplifying stage, used in a signal receiver, the signal amplifying stage comprising:
a fixed-gain low noise amplifier (LNA), receiving and amplifying an input signal;
a variable-gain LNA (VG-LNA) array, receiving and amplifying the input signal, including a plurality of parallel VG-LNAs, the VG-LNA array being parallel with the fixed-gain LNA;
a variable-gain amplifier (VGA), being in series with the fixed-gain LNA and the VG-LNA array, for receiving and amplifying output signals from the fixed-gain LNA and the VG-LNA array to generate an output signal;
an attenuator, being in parallel with a combination of the fixed-gain LNA, the VG-LNA array and the VGA, for receiving and attenuating the input signal to generate the output signal; and
a control loop, coupled to the VGA and the attenuator, for detecting power levels of the output signal to enable and control the fixed-gain LNA, the VG-LNA array, the VGA and the attenuator.

2. The signal amplifying stage according to claim 1, wherein the control loop includes:
a power detector, for detecting the power levels of the output signal; and
a gain control module, for enabling and controlling the fixed-gain LNA, the VG-LNA array, the VGA and the attenuator in response to a detection result from the power detector.

3. The signal amplifying stage according to claim 1, wherein at any moment, the control loop enables one among the fixed-gain LNA, the plurality of the parallel VG-LNAs of the VG-LNA array and the attenuator.

4. The signal amplifying stage according to claim 3, wherein the control loop enables the fixed-gain LNA and the VGA and further controls gain values provided by the VGA when the input signal has power levels smaller than a first predetermined value.

5. The signal amplifying stage according to claim 4, wherein the control loop enables the VGA and one among the plurality of the parallel VG-LNAs of the VG-LNA array and further controls gain values provided from the VGA and the enabled one among the plurality of the parallel VG-LNAs of the VG-LNA array when the input signal has the power levels larger than the first predetermined value but smaller than a second predetermined value.

6. The signal amplifying stage according to claim 5, wherein the control loop enables and controls attenuation provided by the attenuator when the input signal has the power levels larger than the second predetermined value.

7. A signal receiver, comprising:
a signal amplifying stage, for receiving and amplifying an input signal to generate a first output signal, the signal amplifying stage amplifying the input signal in a fixed gain, in gain values or in attenuation, variable gains and attenuation steps being controlled by a close loop control in accordance with power levels of the first output signal;
a mixer stage, coupled to the signal amplifying stage, for mixing the first output signal with a reference clock signal to generate second output signals; and
an output section, for receiving, filtering, amplifying and cancelling offset of the second output signals from the mixer stage to generate a third output signal;
a fixed-gain low noise amplifier (LNA), receiving and amplifying the input signal, the fixed-gain LNA for providing the fixed gain;

wherein the signal amplifying stage comprises:
- a variable-gain LNA (VG-LNA) array, receiving and amplifying the input signal, including a plurality of parallel VG-LNAs, the VG-LNA array being parallel with the fixed-gain LNA, the VG-LNA array for providing the gain values;
- a first variable-gain amplifier (VGA), being in series with the fixed-gain LNA and the VG-LNA array, for receiving and amplifying output signals from the fixed-gain LNA and the VG-LNA array to generate the first output signal, the first VGA for providing the gain values;
- an attenuator, being in parallel with a combination of the fixed-gain LNA, the VG-LNA array and the first VGA, receiving and attenuating the input signal to generate the first output signal, the attenuator for providing the attenuation steps; and
- a control loop, coupled to the first VGA and the attenuator, for detecting power levels of the first output signal to enable and control the fixed-gain LNA, the VG-LNA array, the first VGA and the attenuator.

8. The signal receiver according to claim 7, wherein the control loop includes:
- a power detector, for detecting the power levels of the first output signal; and
- a gain control module, for enabling and controlling the fixed-gain LNA, the VG-LNA array, the first VGA and the attenuator in response to a detection result from the power detector.

9. The signal receiver according to claim 7, wherein at any moment, the control loop enables one among the fixed-gain LNA, the plurality of the parallel VG-LNAs of the VG-LNA array and the attenuator.

10. The signal receiver according to claim 9, wherein the control loop enables the fixed-gain LNA and the first VGA and further controls the gain values provided by the first VGA when the input signal has power levels smaller than a first predetermined value.

11. The signal receiver according to claim 10, wherein the control loop enables the first VGA and one among the plurality of the parallel VG-LNAs of the VG-LNA array and further controls the gain values provided from the first VGA and the enabled one among the plurality of the parallel VG-LNAs of the VG-LNA array when the input signal has the power levels larger than the first predetermined value but smaller than a second predetermined value.

12. The signal receiver according to claim 11, wherein the control loop enables and controls the attenuation provided by the attenuator when the input signal has the power levels larger than the second predetermined value.

13. The signal receiver according to claim 7, wherein the mixer stage comprises:
- a phase shifter, for shifting phases of the reference clock signal;
- a first mixer circuit, for mixing the first output signal with an output signal from the phase shifter; and
- a second mixer circuit, for mixing the first output signal with another output signal from the phase shifter.

14. The signal receiver according to claim 7, wherein the output section comprises:
- a filter, coupled to the mixer stage, for receiving and filtering the second output signals from the mixer stage;
- a DCOC (DC-offset cancelling) circuit, coupled to the filter, for cancelling a fourth output signal from the filter; and
- a second VGA, coupled to the filter, for amplifying the fourth output signal from the filter to generate the third output signal.

15. The signal receiver according to claim 7, further comprising:
- a phase-locked loop (PLL), for receiving an input clock signal; and
- an oscillator, coupled to the PLL, the PLL and the oscillator generating the reference clock signal based on the input clock signal.

* * * * *